/ Third Internal Confer. on Dig. Sat. Comm. 1975, pp. 301–307, Reidel, et al.

United States Patent [19]
Naito et al.

[11] 4,157,514
[45] Jun. 5, 1979

[54] SYNCHRONIZING SIGNAL GENERATOR

[75] Inventors: Yushi Naito; Yoichi Moritani; Yoshinori Uchida, all of Hyogo, Japan

[73] Assignee: Mitsubishi Denki Kabushiki Kaisha, Tokyo, Japan

[21] Appl. No.: 911,086

[22] Filed: May 31, 1978

[30] Foreign Application Priority Data

May 31, 1977 [JP] Japan .................................. 52/64185

[51] Int. Cl.² ............................................. H03B 3/04
[52] U.S. Cl. ........................................ 331/4; 325/473; 331/12
[58] Field of Search .................... 331/11, 12, 4, 1, 78; 325/377, 473

[56] References Cited

PUBLICATIONS

"The Initial Acquisition Unit of the TDMA-System,"

Primary Examiner—John Kominski
Attorney, Agent, or Firm—Wenderoth, Lind & Ponack

[57] ABSTRACT

An incoming signal including the object signal and plurality of noise signals dispersed about the object signal is fully masked with white noise and applied to a phase synchronization loop wide in loop band width and including a local oscillator repeatedly swept by a sweep generator. During the repeated sweep a control signal generator successively decreases the level of the white noise until the oscillator is locked in the phase of the object signal. At that time the signal control generator is operated to suspend the sweeping operation and prevent the white noise from being added to the incoming signal.

4 Claims, 9 Drawing Figures

SYNCHRONIZING SIGNAL GENERATOR

BACKGROUND OF THE INVENTION

This invention relates to a synchronizing signal generator for generating a synchronizing signal surely synchronized with the desired signal.

Synchronizing signal generators of the type referred to have the function that the input signal applied, as a reference signal, thereto is directly or indirectly compared with an oscillating signal produced by the local oscillator and the oscillator is controlled within the feedback loop for phase synchronization so as to render a difference in frequency between both signals while one portion of the oscillating signal thus controlled is delivered as the synchronizing signal. The input signal includes the requisite signal with which the synchronizing signal to be delivered is synchronized and a plurality of unrequisite signals dispersedly located about the requisite signals.

When the feedback loop has a narrow loop band width, the local oscillator might be erroneously locked in a phase of any of the unrequisite signals.

In order to avoid this erroneous locking of the local oscillator, it has been previously proposed to connect a variable attenuator to the feedback loop so that the input signal is first attenuated enough to have a voltage lower than a threshold value of a phase detector included in the feedback loop. Then the attenuation of the input signal is gradually decreased until the local oscillator is locked in the phase of the requisite signal. This measure has been inevitably disadvantageous in that, with loop constants varied, the pull-in operation is apt to be unstable because the requisite and unrequisite signals are applied to the feedback loop with their low levels due to the similar attenuation of both signals.

In order to eliminate thus disadvantage, it has been already proposed to substitute a white noise generator and a noise control for the variable attenuator. White noise from the white noise generator is controlled by the noise control to have its level equal to or higher than levels of the unrequisite signals but lower than that of the requisite signal. The white noise thus contrtolled in level is added to the input signal to mask the unrequisite signals. Then the input signal with the white noise is applied to the feedback loop for phase synchronization having a wide loop band width to lock the local oscillator in the phase of the requisite signal, whereupon the white noise is prevented from being added to the input signal. This measure has been disadvantageous in that, even though the local oscillator would have been locked in the phase of the requisite signal, an output developed in an synchronizing signal output terminal causes the phase jitter due to any of the unrequisite signal entering the wide loop band after the removal of the white noise.

Accordingly it is an object of the present invention to provide a new and improved synchronizing signal generator for generating a synchronizing signal with a high S/N ratio through the synchronization with the requisite signal included in an input signal having added thereto unrequisite or noise signals at levels as required and the removal of the noise signals after the synchronization.

It is another object of the present invention to provide a new and improved synchronizing signal generator for generating a synchronizing signal with a high S/N ratio synchronized with the requisite or object signal lying within a wide frequency range and in the stabilized operating state.

SUMMARY OF THE INVENTION

The present invention provides a synchronizing signal generator having applied thereto an incoming signal including the object signal and a plurality of noise signals dispersedly located in a frequency range adjacent to the object signal to generate a synchronizing signal phase synchronized with the objedt signal. The synchronizing signal generator comprises a white noise generator for generating white noise in the frequency range adjcacent to the object signal, a noise signal generation circuit responsive to a suppression signal applied thereto to attenuate controllably the white noise from the white noise generator, a composition circuit for composing a signal of the incoming signal and the controllably attenuated white noise from the noise signal generation circuit, and a synchronizing signal generation circuit operative with the composite signal from the composition circuit to be selectively synchronized with a signal included in the composite signal and having a stabilized phase thereby to generate the synchronizing signal, the synchronizing signal generation circuit responding to the generation of the synchronizing signal to produce the suppression signal.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
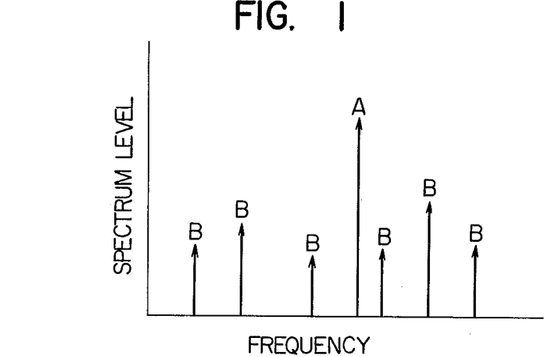
FIG. 1 is a diagram illustrating a frequency spectrum including the object signal and a plurality of noise signals.

Referring now to FIG. 1 of the drawings, there is illustrated a frequency spectrum of a signal including the requisite signal represented by a spectrum line A and a plurality of unrequisite signals represented by spectrum lines B located close to the spectrum line A and on both side thereof. As shown in FIG. 1, each of the unrequisite signals B has a lower intensity or level than that of the requisite signal A. The reference characters A and B also designate frequencies and levels of the associated signals respectively.

Figure 2:
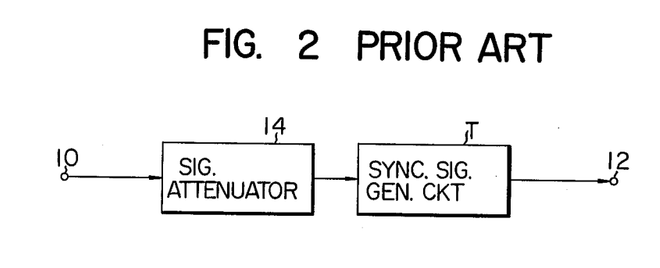
FIG. 2 is a block diagram of synchronizing signal generator constructed in accordance with the principles of the prior art.

Synchronizing signal generators having applied thereto a signal such as shown in FIG. 1, as, the input signal, are not always synchronized with the requisite signal A and may be sometime synchronized with the specified one of the unrequisite signals B, due to the so-called spurious response. In order to prevent this spurious response, conventional synchronizing signal generators have comprised the signal attenuator connected between the input terminal and the synchronizing signal generation circuit as shown in FIG. 2. In FIG. 2, an input terminal 10 is connected to an output terminal 12 through a signal attenuator 14 and a synchronizing signal generation circuit T serially interconnected. The signal attenuator 14 has attenuated an incoming signal applied to the input terminal 10 thereby to decrease a response sensitivity of an synchronizing signal generator to an extent that the latter is responsive to the requisite signal A but not to the unrequisite signals B.

This measure has permitted a synchronizing signal synchronized with the requisite signal A to appear at the output terminal 12. However, the requisite signal A per se is applied to the synchronizing signal generator circuit T after it has been attenuated by the signal attenuator 14. This has given rise to a problem that the pull-in operation is unstable.

In order to pick up only the requisite signal (which is called hereinafter the "object signal") A from the signal shown in FIG. 1 as including further the unrequisite signals (which are called hereinafter "noise signals"), it is a common practice to form a feedback loop including a local oscillator and a phase detector within the synchronizing signal generation circuit T. In the feedback loop the phase detector phase detects an incoming signal with an output from the local oscillator and an oscillation frequency of the local oscillator is controlled with an output from the phase detector so that the incoming signal has a phase coinciding with that of the output from the local oscillator to render the output from the phase detector substantially null. Where a frequency band occupied by the object signal is narrow, the feedback loop has had a loop band-width designed to be narrow correspondingly.

Figure 3:
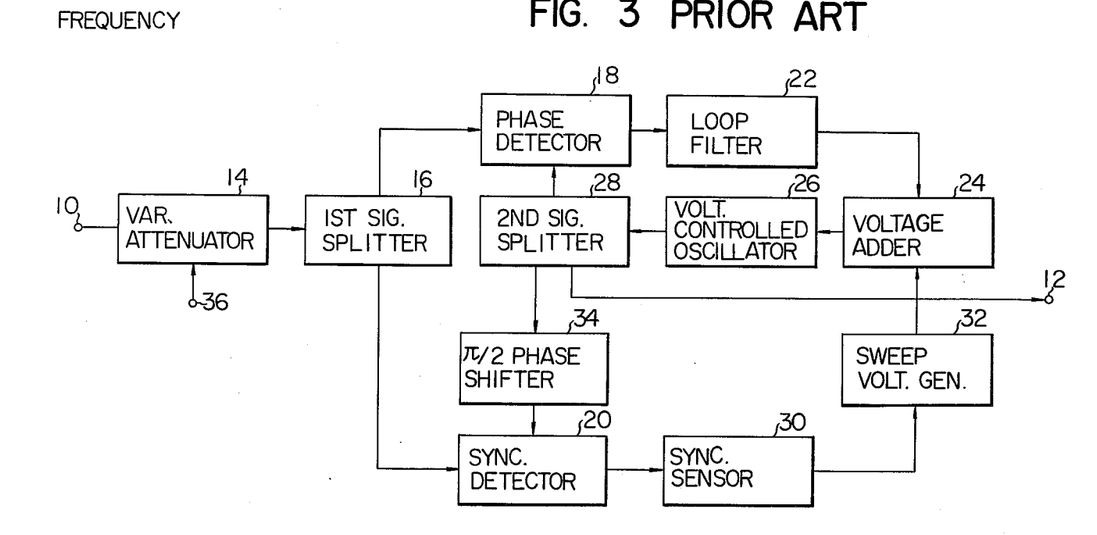
FIG. 3 is a block diagram of the details of the arrangement shown in FIG. 2.

With the oscillation frequency of the local oscillator controlled within the feedback loop having a narrow loop band width, there has been an opportunity to lock the phase of the local oscillator in any one of the noise frequencies designated by the reference character B as does it in the object frequency designated by the reference character A. Once the local oscillator has been locked in any one of the noise frequencies B, it is generally disabled to be locked in the object frequency A. In order to prevent the local oscillator from being erroneously locked in such a noise frequency, there has been already proposed a synchronizing signal generator such as shown in FIG. 3. In the arrangement of FIG. 3, the signal attenuator 14 also shown as being a variable attenuator is connected to a first signal splitter 16 subsequently connected to both a phase detector 18 and a synchronous detector 20. The phase detector 18 is connected to a loop filter 22 that is connected back to the phase detector 18 through a voltage added 24, a voltage controlled local oscillator 26 and a second signal splitter 28 serially interconnected in the named order to form a feedback loop for phase synchronization.

On the other hand, the synchronous detector 20 is connected to a synchronization sensor 30 subsequently connected to a sweep voltage generator 32 that is connected to the voltage adder 24. The second signal splitter 28 is connected to the output terminal 12 and also to the synchronous detector 20 through a $\pi/2$ phase shifter 34.

An incoming signal including the object signal A and a plurality of noise signals B (see FIG. 1) is first attenuated by the variable attenuator 14 enough to have a voltage lower than threshold values of the phase and synchronous detectors 18 and 20 respectively. The variable attenuator 14 is responsive to a control signal applied to its control input 36 to decrease gradually an amount of attenuation of the incoming control purpose.

The attenuated signal from the variable attenuator 14 is applied to the signal splitter 16 to be divided into a pair of signal portions which are supplied to the phase and synchronous detectors 18 and 20 respectively. One of the signal portions supplied to the phase detector 18 has initially a voltage too low to be phase detected thereby as above described but its attentuation is gradually decreased until only the object signal A having the highest level first exceeds the threshold value of the phase detector 18. At that time a detected output from the phase detector 18 resulting from the object signal A enters the loop filter 22. Under these circumstances, the sweep voltage generator 32 is in operation to apply a saw-toothed waveform to the voltage controlled oscillator 26 through the voltage adder 24. The voltage adder 24 adds the saw-toothed waveform to an output from the loop filter 22. Therefore an oscillation frequency of the oscillator 26 is swept until a time point is reached at which the oscillation frequency from the voltage controlled oscillator 26 approximates to the frequency of the object signal A to lower sufficiently a freqency of the output from the phase detector 18.

Then, the output from the phase detector 18 passes through the loop filter 22 having a narrow loop band width to enter the voltage controlled oscillator 26 through the voltage adder 24. This causes the above-mentioned feedback loop to be put in operation whereby the voltage controlled local oscillator 26 has its frequency and phase synchronized with those of the object signal A respectively.

Once this phase synchronization has been established, the synchronous detector 20 delivers the object signal A to the synchronization sensor 30. That is, the synchronous detector 20 receives the other signal portion from the first signal splitter 16 and effects the synchronous detection thereof with a portion of the output from the voltage controlled oscillator 26 split by the second signal splitter 28 and subjected to a phase shift of $\pi/2$ radians through the $\pi/2$ phase shifter 34. The phase shift of $\pi/2$ radians results from the assumption that the incoming signal is phase modulated to include a component with a phase shift of $\pi/2$ radians.

When the synchronization sensor 30 senses the presence of the output from the synchronous detector 20, it delivers a control signal to the sweep voltage generator 32 thereby to stop the operation of the sweep voltage generator 32.

In this way, the voltage controlled local oscillator 26 has been locked in the phase of the object signal A but not of any one of the noise signals. Also the attenuation of the incoming signal effected the variable attenuator 14 is set to its magnitude ensuring that the local oscillator 26 is locked in the phase of the object signal A.

In order to decrease gradually the attenuation of the incoming signal effected by the variable attenuator 14 from its initial large magnitude to its magnitude just described and set it to the latter, a control generator is provided to apply the abovementioned control signal to the variable attenuator 14 through the control input 36 thereof although the control generator is not illustrated because it can readily be designed and constructed for the particular control purpose.

From the foregoing, it will be seen that the object and noise signals A and B respectively are similarly attenuated by the variable attenuator 14 and entered into the phase synchronization feedback loop. Accordingly, the arrangement of FIG. 3 has been inevitably disadvantageous in that, with circuit constants of the phase synchronization loop varied, the pull-inoperation is apt to be unstable.

Figure 4:
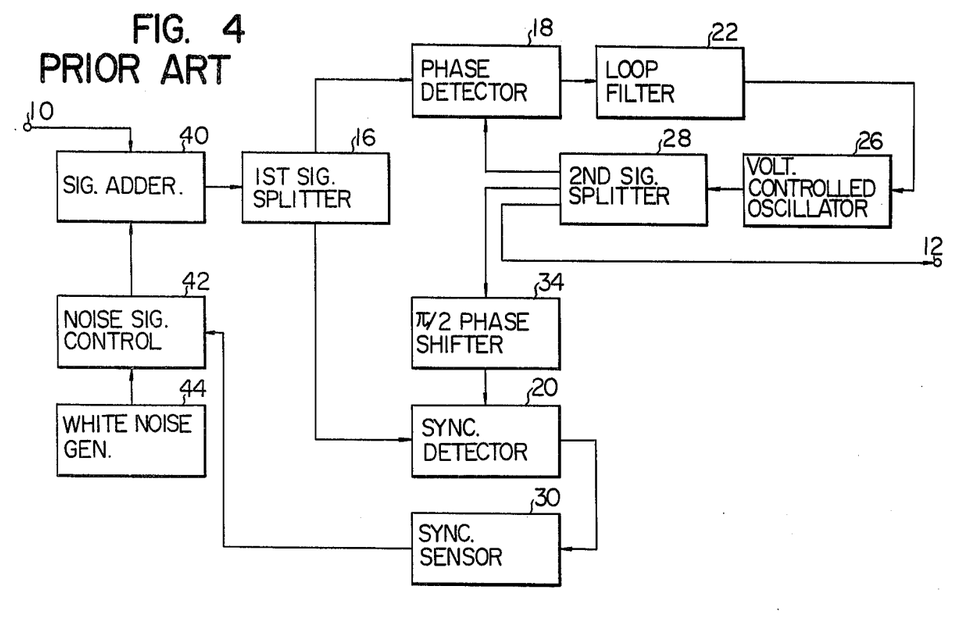
FIG. 4 is a diagram similar to FIG. 3 but illustrating another synchronizing signal generator constructed in accordance with the principles of the prior art.

The arrangement illustrated in FIG. 4 is different from that shown in FIG. 3 principally in that, in FIG. 4 series combination of a signal adder 40, a noise signal control 42 and a white noise generator 44 is substituted for the variable attenuator 14 in order to utilize the effect that white noise masks the noise signals B dispersedly located about the object signal A. The signal adder 40 receives an incoming signal including the object and noise signals A and B respectively (see FIG. 1) and delivers its output to the signal splitter 16 with the voltage adder 24 and the sweep voltage generator 32 omitted. In FIG. 4 like reference numerals designate the components identical to those shown in FIG. 3.

White noise from the white noise generator 44 is applied to the noise signal control 42 where it is initially controlled to its level equal to or higher than that of the noise signals B but lower than that of the object signal A (see FIG. 1). Then the white noise thus controlled is applied to the signal adder 40 where all frequency intervals formed among the dispersed spectrum lines representative of the object and noise signals A and B respectively are filled with the white noise similar in level to the noise signals B. Thus the incoming signal entering the signal adder 40 through the input terminal 10 has the entire frequency band masked with the white noise and then applied to the signal splitter 16.

One portion of the output from the signal splitter 16 is supplied to the phase detector 18 where the object signal A having its level sufficiently higher than that of the white noise is phase detected with the output from the voltage controlled local oscillator 26 to produce a phase detected output. The output from the phase detector 18 is delivered to the loop filter 22. Since the loop filter 22 shown in FIG. 4 has a pass band width sufficiently wider than that of the loop filter 22 shown in FIG. 3, the phase detected output from the phase detector 18 is permitted to pass through the loop filter 22, even though a difference in frequency between the object signal A and the output from the oscillator 26 would be relatively large at the beginning of the operation. Therefore the feedback loop is operated to effect the phase synchronization until the oscillation frequency and phase of the voltage controlled oscillator 26 are synchronized with the frequency and phase of the object signal A respectively. That is, the phase synchronization is established whereupon the synchronous detector 20 delivers the object signal A to the synchronization sensor 30. The synchronization sensor 30 senses the presence of the output from the synchronous detector 20 to control the noise signal control 42 so that the white noise is prevented from entering the signal adder 40.

From the foregoing it is seen that the arrangement of FIG. 4 has a broad pull-in range with the result that the feedback loop is required to have a wide band width. Due to the wide loop band width, the noise signals B having the dispersed spectrum lines are apt to be included within the wide loop band width. This has resulted in the disadvantage that, even though the voltage controlled oscillator has been first synchronized with the object signal A, the removal of the internal white noise from the incoming signal causes the phase jitters to appear at an output developed on the output terminal 12 for the synchronizing signal due to the dispersed noise spectrum lines B coming in the wide loop band.

The present invention contemplates to eliminate the disadvantages of the prior art practice as above described.

Figure 5:
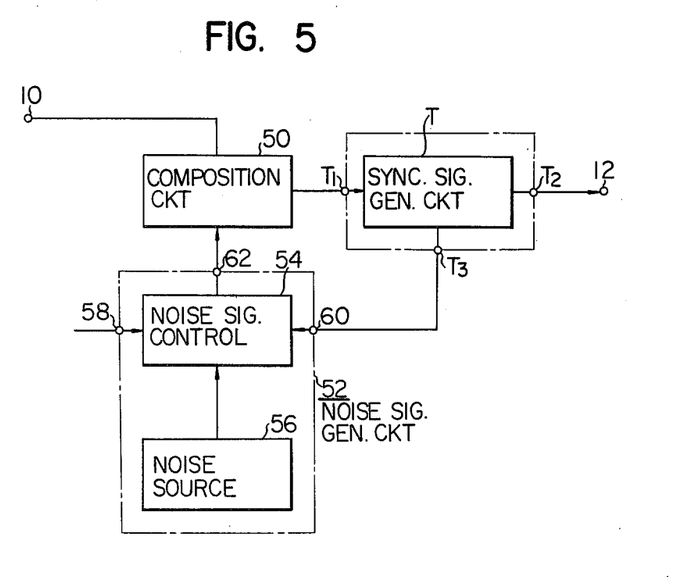
FIG. 5 is a block diagram useful in explaining the principles of the present invention.

Referring now to FIG. 5, there is illustrated the basic form of a synchronizing signal generator constructed in accordance with the principles of the present invention. The arrangement illustrated comprises an input terminal 10 and an output terminal 12 and a composition circuit 50 and a synchronizing signal generation circuit T serially interconnected across both terminals. The synchronizing signal generation circuit T includes a reference signal terminal $T_1$ connected to the composition circuit 50, a synchronizing signal terminal $T_2$ connected to the output terminal 12 and a status signal terminal $T_3$ and it is operative to deliver to the terminal $T_2$ a synchronizing signal synchronized with a reference signal applied to the terminal $T_1$ while delivering the terminal $T_3$ a status signal indicating that the circuit T is maintained in its synchronized state to deliver the synchronizing signal to the terminal $T_2$.

A noise signal generation circuit generally designated by the reference numeral 52 includes a noise signal control 54 connected to the composition circuit 50 and a noise source 56 connected to the noise signal control 54. The noise signal control 54 includes a start control terminal 58, a suppression control terminal 60 connected to the status signal terminal $T_3$ of the synchronizing signal generation circuit T and a noise signal terminal 62 connected to the composition circuit 50.

When a control signal having a constant large magnitude is applied to the start control terminal 58, a noise signal generated by the noise source 56 and having a constant large magnitude is developed at the noise signal terminal 62. Upon the start of the synchronizing signal generation circuit T, the control signal is initiated to decrease with time to cause the noise signal at the noise signal terminal 62 to decrease with time. Also when the status signal from the synchronizing signal generation circuit T is applied to the suppression control terminal 60 through the status terminal $T_3$, the noise signal developed at the terminal 62 is controlled to a suppressed magnitude.

Figure 6:
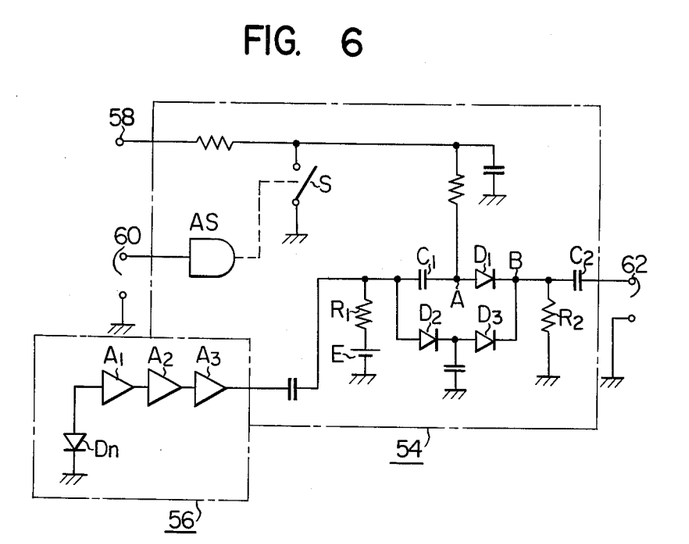
FIG. 6 is a block diagram of the noise signal control circuit shown in FIG. 5.

The noise signal generation circuit 52 may be of a circuit configuration shown in FIG. 6. The noise source 56 includes a semiconductor noise diode $D_n$ having a cathode electrode connected to ground and an anode electrode connected to a series combination of three amplifiers $A_1$, $A_2$ and $A_3$. Noise generated by the noise diode $D_n$ is successively amplified by the amplifiers $A_1$, $A_2$ and $A_3$ and then applied to the noise signal control circuit 54.

The noise control circuit 54 comprises a capacitor connected to one side to the amplifier $A_3$ and on the other side to the resistor $R_1$ subsequently connected to a positive side of a DC source E. The source E is connected on the negative side to ground and the resistor $R_1$ is connected to a series combination of a capacitor $C_1$, and a semiconductor diode $D_1$ and also to another series combination of two semiconductor diodes $D_2$ and $D_3$ with the junction of both diodes $D_2$ and $D_3$ connected via a capacitor to ground. Both series combinations are connected in parallel to each other while being connected to ground through a resistor $R_2$ and to the noise signal terminal 62 through a capacitor $C_2$. All the diodes $D_1$, $D_2$ and $D_3$ are similarly poled and a current from the source E can flow through the resistors $R_1$ and $R_2$ and the diodes $D_2$ and $D_3$ to hold the junction B of the diodes $D_1$ and $D_3$ at a predetermined voltage.

The junction A of the capacitor $C_1$ and the diode $D_1$ is connected to a resistor that is connected to ground through a capacitor and also to the start control terminal 52 through another resistor. The latter resistor is connected to ground through a normally open switch S. The switch S is controlled by an analog switch AS connected to the suppression control terminal 60.

Referring back to FIG. 5, the composition circuit 50 composes a signal of an incoming signal such as shown in FIG. 1 and the noise signal from the noise signal generation circuit 52. The signal thus composed enters the synchronizing signal generation circuit T. Initially, the control signal with the constant large magnitude is applied to the start control terminal 58 to put the junction A (FIG. 6) at a voltage sufficiently higher than that of the junction B (see FIG. 6). Thus the diode $D_1$ is brought into its substantially full conducting state to permit the noise signal developed at the noise signal terminal 62 to have a constant magnitude sufficient to embed the incoming signal therein in the composition circuit 50. Under these circumstances, the signal applied to the reference signal terminal $T_1$ of the synchronizing signal generation circuit T has its phase disturbed with the noise signal and therefore not fixed. As a result, the synchronizing signal generation circuit T can not respond to such a signal and therefore is disabled to generate a synchronizing signal synchronized with that signal.

Figure 7:
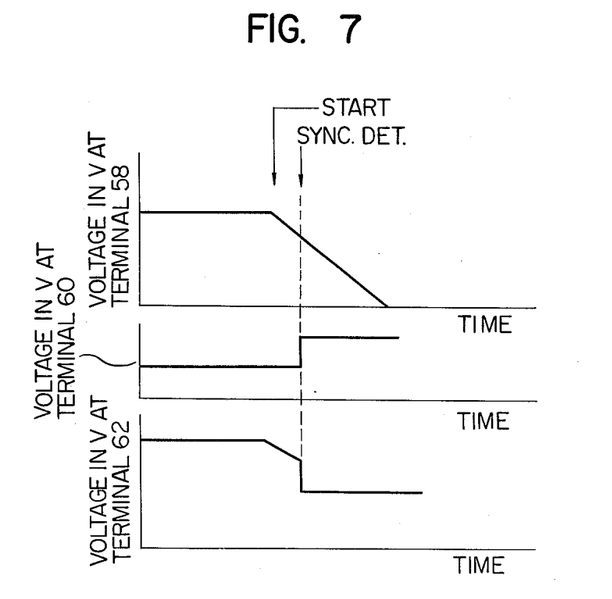
FIG. 7 is a graph illustrating waveforms developed at various points in the arrangement shown in FIG. 6.

In order that the generation circuit T is initiated to generate a synchronizing signal, the control signal applied to the start control terminal 58 is decreased with time from time point labelled "START" shown on the uppermost portion of FIG. 7. This causes the voltage at the junction A to decrease correspondingly with respect to that at the junction A thereby to lower gradually the conduction of the diode $D_1$ (see FIG. 7) resulting in the noise signal at the terminal 62 decreasing with time as shown at waveform on the lowermost portion of FIG. 7. Waveform shown on the uppermost portion of FIG. 7 describes the manner in which the control signal at the start control terminal 58 decreases.

During this decrease in control signal, time point is reached at which the requisite or object signal such as the signal A (see FIG. 1) has its top projecting beyond the embedding noise signal white noise signals such as signals B (see FIG. 1) originally included in the incoming signal remain embedded by the noise signal from the noise signal generation circuit 52. This occurs at time point labelled "SYNC. DET." on the uppermost portion of FIG. 7. Under these circumstances the signal applied to the reference terminal $T_1$ has its phase held to approximate substantially that of the object signal although it is more or less attended with a phase jitter because the phase of the incoming signal is affected by the embedding noise signal. Therefore the synchronizing signal generation circuit T can selectively respond to the object signal to be synchronized with the latter.

As a result, the generation circuit T generates a synchronizing signal synchronized with the object signal while at the same time it delivers to the status terminal $T_3$ a status signal indicating that the circuit T is put in its synchronized state to deliver the synchronizing signal to the terminal $T_3$.

That status signal (see waveform shown on the intermediate portion of FIG. 7) is applied to the suppression control terminal 60 of the noise signal control 54 to turn the analog switch AS on to close the switch S (see FIG. 6). In FIG. 6 the closure of the switch S puts the junction $A_1$ at ground potential thereby to render the diode $D_1$ non-conducting. Accordingly, the noise signal from the noise diode $D_n$ is permitted only to pass, through the diodes $D_2$ and $D_3$ and developed at the noise terminal 62 with a suppressed or reduced magnitude as shown at waveform on the lowermost portion of FIG. 7.

Therefore, the signal entering the synchronizing signal generator circuit T through the reference terminal $T_1$ is free from the phase jitter resulting from noise and the circuit T produces a stable synchronizing signal at the synchronizing signal terminal $T_3$.

Figure 8:
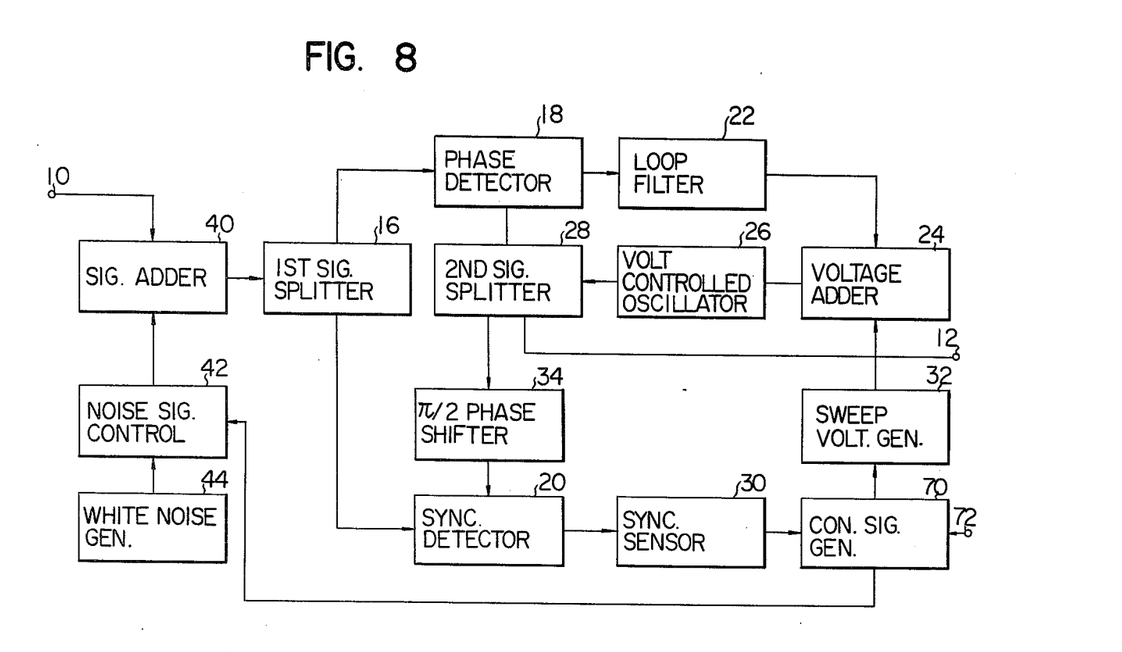
FIG. 8 is a block diagram of a synchronizing signal generator constructed in accordance with the principles of the present invention.

Referring now to FIG. 8, there is illustrated one embodiment according to the synchronizing signal generator of the present invention. The arrangement illustrated comprises the series combination of signal adder, noise signal control and white noise generator 40, 42 and 44 as above described in conjunction with FIG. 4 and the synchronizing signal generation circuit identical to that shown in FIG. 3 excepting that a control signal generator 70 with a start control terminal 72 is connected between the synchronization sensor 30 and the sweep voltage generator 32. Therefore, in Figure, like reference numerals have been employed to identify the components identical or corresponding to those shown in FIGS. 3 and 4.

A phase modulated carrier wave having a frequency spectrum such as shown in FIG. 1 is applied to the input terminal 10 as an incoming signal. Then the incoming signal enters the signal adder 40 where it is added to a white noise generated by the white noise generator 44 and controlled by the noise signal generator 26 within the noise signal control 42. The signal added with the white noise is applied to the first signal splitter 16 after which it is proccessed in the manner substantially identical to that above described in conjunction with FIG. 3.

Since the white noise is added to a frequency spectrum representing the object and noise signals A and B respectively such as shown in FIG. 1, that portion of the frequency spectrum lower in level than the white noise is masked with the latter to produce an output from the phase detector 18 as above described in conjunction with FIG. 4.

In the arrangement of FIG. 8, it is to be noted that the loop filter 22 has a narrow loop band width as does the loop filter 22 shown in FIG. 3 and accordingly the sweep voltage generator 32 is provided as in the arrangement of FIG. 3.

With the object signal A higher in level than the white noise, the voltage controlled local oscillator 26 has its oscillation frequency ans phase locked in those of the object signal A and the synchronous detector 20 deliver an output voltage to the synchronization sensor 30. In the synchronization sensor 30, the output voltage from the synchronous detector 20 is subjected to the low band filtering and then compared with a predetermined threshold value thereof. The synchronization sensor 30 delivers to the control signal generator 70 an output indicating whether or not the synchronous detector 20 produces the output voltage in accordance of the result of the comparison. The control signal generator 70 is responsive to a start control signal applied to the start control terminal 72 (which corresponds to the start control terminal 58 shown in FIG. 5) to be started.

When started, the control signal generator 70 delivers a noise control signal to the noise signal control 42 to set the level of the white noise applied to the signal adder 40 to be the highest while at the same time, it applies a sweep control signal to the sweep voltage generator 32 to generate cyclically a sweep voltage therefrom for sweeping repeatedly the local oscillator 26.

The operation of the control signal generator 70 will now be described in more detail with reference to FIG. 9 wherein there is illustrated, by way of example, the relationship between a frequency f (in abscisssa) and a level p (in ordinate) of each of the object signal A and noise signals $B_1$, $B_2$, ... $B_m$ included in the incoming signal. The start control signal applied to the start control terminal 72 sets the white noise to an equivalent maximum noise level PN1, shown in FIG. 9. If the output from the synchronization sensor 30 does not indicate the synchronized state at time point where a first sweep cycle has been completed then the control signal generator 70 is operated to decrease the noise control signal by a predetermined constant amount thereby to decrease the equivalent white noise level applied to the signal adder 40 by a predetermined fixed amount followed by the next succeeding sweep cycle. The equivalent white noise level thus decreased is designated by PN2 in FIG. 9. The process as above described is repeated until the synchronization sensor 30 produces the output indicating that the synchronization is sensed. That is, the equivalent white noise level is successively decreased in accordance with a predetermined program as shown by PN3, PN4, ... PNn, in FIG. 9.

Figure 9:
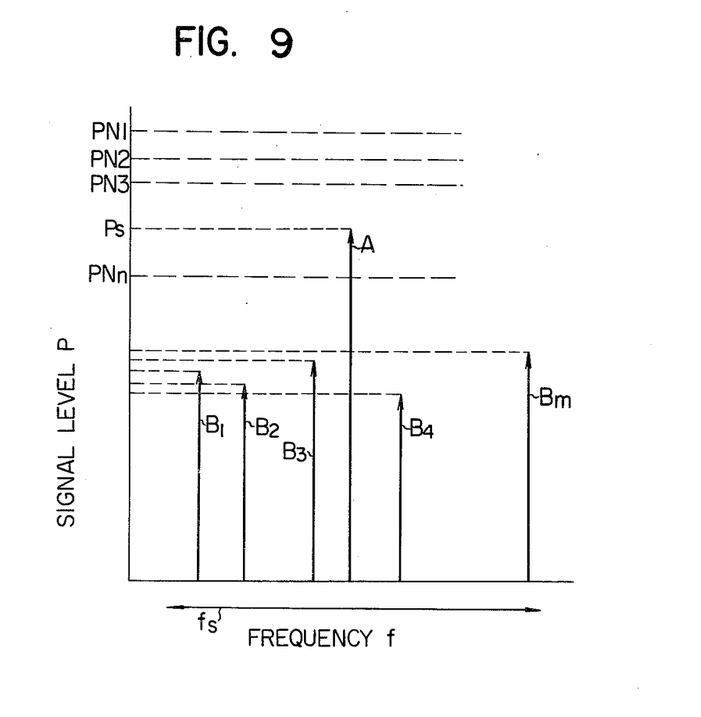
FIG. 9 is a diagram of a frequency spectrum illustrating the relationship between a signal freqency and a signal level developed in the pull-in process of the arrangement shown in FIG. 8.

It will readily be understood that the voltage controlled oscillator 26 is repeatedly swept over a frequency band ranging from a frequency somewhat lower than a minimum noise frequency, in this case, a noise frequency $B_1$ to a frequency somewhat higher than a maximum noise frequency or a noise frequency Bm and designated by the reference character fs in FIG. 9. As shown in FIG. 9 the object frequency lies in the sweep frequency band fs.

From FIG. 9 it is seen that the n-th sweep has been effected with the equivalent white noise level PNn lower than the level Ps of the object signal A. At that time, the object signal A is higher in level than the white noise enough to synchronize the output from the local oscillator 26 with the object signal A. Thus the synchronization sensor 30 senses this synchronization to deliver a control signal to the sweep voltage generator 32 to suspend the sweep by the latter and simultaneously to deliver a suppression signal to the noise signal control 42 to prevent the white noise from being applied to the signal generator 40. However, the white noise may be suppressed to a low magnitude as above described in conjunction with FIGS. 6 and 7.

In the arrangement of FIG. 8, the pass band width of the loop filter 32 is narrow as compared with that shown in FIG. 4. Thus even after the phase synchronization has been established and the white noise has been removed from the signal adder 40, any of the dispersed noise signals B has few opportunities to entering the loop band and therefore no phase jitter is caused. Also there is no disadvantage that in the arrangement of FIG. 2, the variable attenuator 14 continues still to attenuate the incoming signal even after the completion of the phase synchronization resulting in the unreliable operation of the phase synchronization feedback loop.

From the foregoing it is seen that the synchronizing signal generator of the present invention shown in FIG. 8 can generate a synchronizing signal with a good S/N ratio by synchronizing precisely a frequency and a phase of a local oscillator with those of the object signal applied thereto along with a plurality of noise signals having spectrum lines dispersedly located about the object spectrum line by using a phase synchronization loop having a wide pull-in range due to the sweep operation and a narrow loop band width.

Also, as above described, the present invention is arranged to effect the synchronization with an externally applied input signal having added thereto a local noise signal and to remove that noise signal after the synchronization has been effected. Therefore the present invention gives the result that even with an unrequisite signal or signals included, in addition to the requisite signal, in the input signal, the synchronization with the requisite signal is effected free from mistakes to generate a synchronizing signal with a high quality.

While the present invention has been illustrated and described in conjunction with a few preferred embodiments thereof it is to be understood that numerous changes and modifications may be resorted to without departing from the spirit and scope of the present invention. For example, although the control signal as required has been applied to the start control terminal 58 in the arrangement shown in FIGS. 5 and 6, an externally applied input signal may be detected and then applied to the terminal 58. This measure provides a synchronizing signal generator including the synchronizing signal generation circuit T operative similtaneously with the application of the input signal to generate a synchronizing signal as required.

While the present invention has been also described in terms of the phase synchronization with a single-phase phase modulated carrier wave and in conjunction with FIGS. 8 and 9 it is to be understood tht the present invent is not restricted thereto or thereby and that the same is equally applicable to n-phase phase-modulated carrier waves. In the latter case the phase synchronization loop operated with a signal having a frequency equal to n times that of a received signal. Also the external start control signal may be formed of a signal generated by sensing a transition of the output from the synchronous detector indicating the synchronism to that indicating the synchronism with such a signal use, the occurrence of a pull-out can immediately change to the automatic pull-in operation to restore quickly the synchronism. In this case, however, an external start control signal is required for performing first the pull-in operation.

What we claim is :

1. A synchronizing signal generator having applied thereto an incoming signal including the object signal and a plurality of noise signals dispersedly located in a frequency band adjacent to said object signal to generate a synchronizing signal phase synchronized with said object signal wherein there are provided a white noise generator for generating white noise in said frequency range, a noise signal generation circuit responsive to a suppression signal applied thereto to attenuate controllably said white noise, a composition circuit for composing a signal of said incoming signal and said controllably attenuated white noise from said noise signal generation circuit, and a synchronizing signal generation circuit operative with said composite signal from said composition circuit to be selectively synchronized with a signal included in said composite signal and having a stabilized phase thereby to generate said synchronizing signal, said synchronizing signal generation circuit responding to the generation of said synchronizing signal to produce said suppression signal.

2. A synchronizing signal generator as claimed in claim 1 wherein there is provided circuit for detecting said incoming signal to produce a detected signal, the entry of said detected signal into said noise signal control circuit causing said synchronizing signal generation circuit to be operated simultaneously with the application of said incoming signal to the synchronizing signal generator.

3. A synchronizing signal generator as claimed in claim 1 wherein said noise signal control circuit includes an analog switch receiving said suppression signal, a semiconductor diode receiving an output from said analog switch, and a control signal input terminal and a white noise input terminal electrically connected to said semiconductor diode on the input side and in parallel circuit relationship with said analog switch.

4. A synchronizing signal generator as claimed in claim 1 wherein said synchronizing signal generation circuit comprises a phase synchronization feedback loop connected to said composition circuit, a synchronous detector, and a sweep voltage generator, said phase, synchronization feedback loop including a phase detector connected to said composition circuit, a loop filter connected to said phase detector, a voltage adder connected to both said loop filter and said sweep voltage generator to add outputs from said loop filter and sweep voltage generator to each other, and a voltage controlled oscillator connected to said voltage adder, said phase detector phase detecting an output from said composite circuit with an output from said voltage controlled oscillator, said voltage controlled oscillator having an oscillation frequency controlled with an output from said voltage adder, said synchronous detector effecting the synchronous detection of said output from said composition circuit with said output from said voltage controlled oscillator, and wherein there is provided a control signal generator receiving an output from said synchronous detector and a start control signal to control said controllable attenuation of said white noise effected by said noise signal control circuit in accordance with a predetermined program, said control signal generator also generating control signals for controlling the start and suspension of the operation of said sweep voltage generator, respectively.

* * * * *